(12) United States Patent
Murali et al.

(10) Patent No.: US 12,445,124 B2
(45) Date of Patent: Oct. 14, 2025

(54) VOLTAGE AWARE BIAS RECEIVER IN AN ANALOG NODE

(71) Applicant: QUALCOMM Incorporated, San Diego, CA (US)

(72) Inventors: Abhinav Murali, Bangalore (IN); Pradeep Kumar Sana, Bangalore (IN)

(73) Assignee: QUALCOMM INCORPORATED, San Diego, CA (US)

( * ) Notice: Subject to any disclaimer, the term of this patent is extended or adjusted under 35 U.S.C. 154(b) by 115 days.

(21) Appl. No.: 18/587,145

(22) Filed: Feb. 26, 2024

(65) Prior Publication Data

US 2025/0274118 A1    Aug. 28, 2025

(51) Int. Cl.
*H03K 17/30* (2006.01)
*H03K 17/10* (2006.01)
*H03K 17/687* (2006.01)

(52) U.S. Cl.
CPC ......... *H03K 17/302* (2013.01); *H03K 17/102* (2013.01); *H03K 17/6872* (2013.01)

(58) Field of Classification Search
CPC . H03K 17/302; H03K 17/102; H03K 17/6872
USPC .......................................................... 327/427
See application file for complete search history.

(56) References Cited

U.S. PATENT DOCUMENTS

| | | | |
|---|---|---|---|
| 2023/0298657 A1* | 9/2023 | Chang | G11C 11/4072 |
| 2024/0214012 A1* | 6/2024 | Cn | H04B 1/04 |
| 2024/0405776 A1* | 12/2024 | Sywyk | G11C 8/10 |

* cited by examiner

*Primary Examiner* — Tomi Skibinski
(74) *Attorney, Agent, or Firm* — Loza & Loza, LLP

(57) ABSTRACT

An apparatus, including: an input node; a bias receiver; and a protection device, a gate of the protection device coupled to the bias receiver, the bias receiver tied to a lower voltage domain level, a first source or drain of the protection device coupled to the input node to receive a current from an analog node or a higher voltage domain level from the analog node and a second drain or source of the protection device coupled to a current output node, when the current is received through the input node to the protection device and the lower voltage domain level is in a non-collapse mode, configured to pass the current through the protection device to the current output node.

20 Claims, 6 Drawing Sheets

VOLTAGE AWARE BIAS RECEIVER IN AN ANALOG NODE

FIELD

Aspects of the present disclosure relate generally to processing circuits, and, in particular, to utilizing a high voltage aware bias receiver in an analog node.

BACKGROUND

Functional circuits, such as processors, memory, SerDes Peripheral PHYs, and others, have components that need to communicate with one another but that may operate at different voltage levels. Often, signals are at one voltage level and need to be translated to signals of another voltage level. There are many examples of types of applications that require the use of multiple voltage levels. In such applications, devices may be used to communicate between different sections of functional circuits (e.g., integrated circuits (ICs)) having different power supply voltages.

Also, circuit nodes are being utilized that are now only accommodating thin-oxide devices. For example, in upcoming lower tech nodes (e.g., Gate All Around) thick-oxide devices are no longer supported.

In some instances, analog nodes need to be operated at a higher voltage for better dynamic performance but are interconnected to analog nodes that operate at lower voltages.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. An apparatus includes: an input node; a bias receiver; and a protection device, a gate of the protection device coupled to the bias receiver, the bias receiver tied to a lower voltage domain level, a first source or drain of the protection device coupled to the input node to receive a current from an analog node or a higher voltage domain level from the analog node and a second drain or source of the protection device coupled to a current output node, when the current is received through the input node to the protection device and the lower voltage domain level is in a non-collapse mode, configured to pass the current through the protection device to the current output node.

Another aspect of the disclosure relates to a method. The method includes: receiving a current from an analog node or a higher voltage domain level from the analog node at an input node; and operating a protection device and a bias receiver tied to a lower voltage domain level coupled to the protection device, the protection device coupled to the input node to receive the current from the analog node or the higher voltage domain level from the analog node and coupled to a current output node, when the current is received through the input node to the protection device and the lower voltage domain level is in a non-collapse mode, the current passes through the protection device to the current output node.

Another aspect of the disclosure relates to an apparatus. The apparatus includes: means for receiving a current from an analog node or a higher voltage domain level from the analog node; means for passing the current through a protection device to a current output node, when the current is received by the protection device and a lower voltage domain level is in a non-collapse mode; and means for not passing the current through the protection device to the current output node, when the current is not present at the protection device, the higher voltage domain level is received at the protection device, and the lower voltage domain level is in a non-collapse mode.

Another aspect of the disclosure relates to a wireless communication device. The wireless communication device includes: at least one antenna; a transceiver coupled to the at least one antenna; and one or more signal processing cores coupled to the transceiver, wherein the one or more signal processing cores comprise: an input node; a bias receiver; and a protection device, a gate of the protection device coupled to the bias receiver, the bias receiver tied to a lower voltage domain level, a first source or drain of the protection device coupled to the input node to receive a current from an analog node or a higher voltage domain level from the analog node and a second drain or source of the protection device coupled to a current output node, when the current is received through the input node to the protection device and the lower voltage domain level is in a non-collapse mode, configured to pass the current through the protection device to the current output node.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
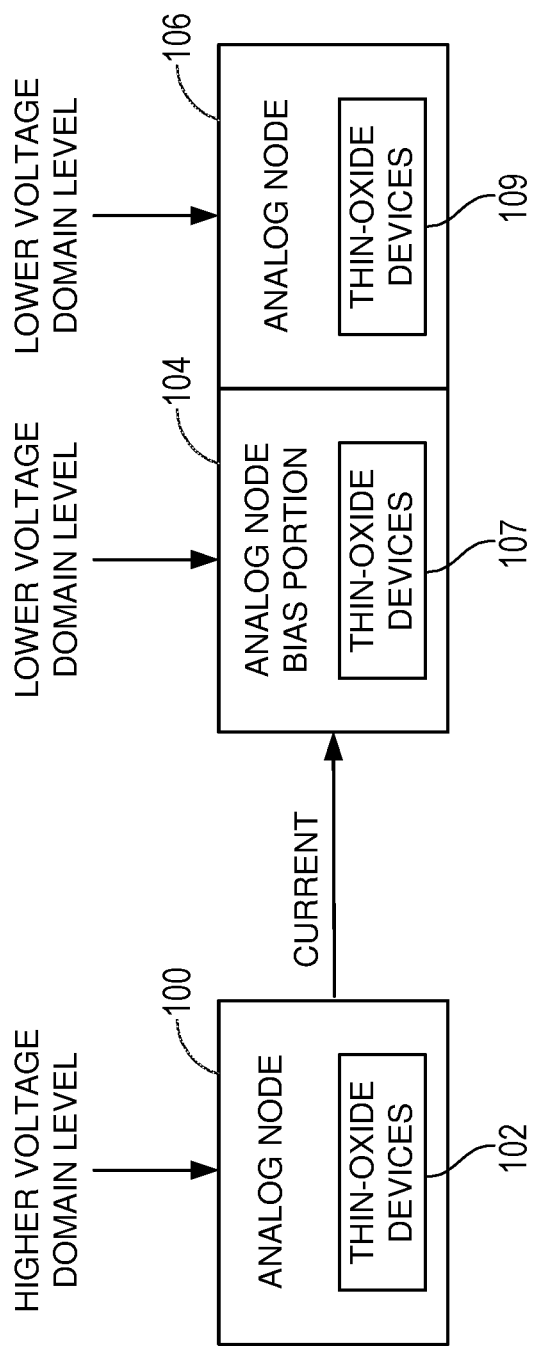
FIG. 1 illustrates a block diagram of an example analog node bias portion coupled to an analog node in accordance with an aspect of the disclosure.

FIG. 1 illustrates a block diagram of an example analog node bias portion 104 coupled to an analog node 100 in accordance with an aspect of the disclosure. As will be described, example analog node bias portion 104 may be coupled to analog node 100. Analog node 100 may be a lower tech node that utilizes thin-oxide devices 102 and that operates at higher voltage than analog node bias portion 104. For example, analog node 100 may operate at a high voltage domain level (e.g., input VCC_HV, e.g., 1.2 V) and supply a current to analog node bias portion 104 that operates at a lower voltage domain level (e.g., 0.875 V). Analog node bias portion 104 may pass the current on to an analog node 106 that also operates at the lower voltage domain (e.g., 0.875 V). Also, analog node bias portion 104 may be part of the analog node 106. Therefore, analog node bias portion 104 may be part of an analog node 106 or may be coupled to it. Both analog node bias portion 104 and analog node 106 may utilize thin-oxide devices 107, 109.

Figure 2A:
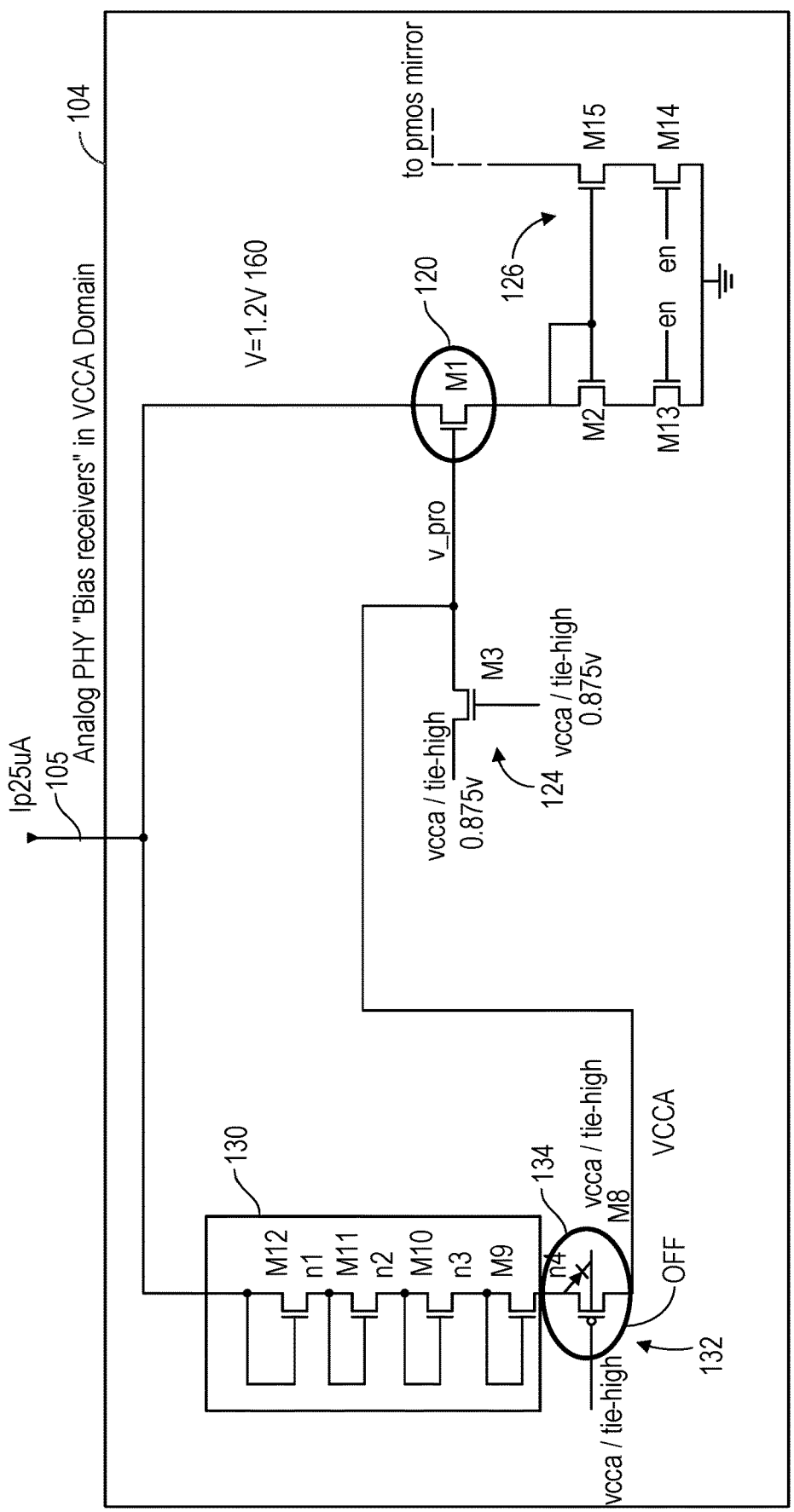
FIG. 2A illustrates a block diagram of an example analog node bias portion in accordance with an aspect of the disclosure.

FIG. 2A illustrates a block diagram of an example analog node bias portion 104 in accordance with an aspect of the disclosure. In this example, example analog node bias portion 104 includes a plurality of coupled Metal Oxide-Semiconductor Field Effect Transistors (MOSFETs). In particular, analog node bias portion 104 may include a protection device 120 that may be implemented with a MOSFET (M1). Further, protection device M1 may be coupled to a bias receiver 124 that may be implemented by M3. Also, coupled to M1 are M2, M13, M14, and M15 126 that may be coupled to a PMOS mirror. Additionally, M1 may be coupled to an auxiliary path including a diode stack 130 that includes M12, M11, M10, M9 that is coupled to a PMOS switch M8 132 and a P-N diode, which is part of M8 (source & bulk). Also, as will be described, these MOSFETs are typically thin-oxide.

Looking more particularly, at FIG. 2A, current (e.g., 25 uA) may flow to the source of M1. The current (e.g., 25 uA) may flow from the analog node 100 previously described that operates at a relatively higher voltage domain level (e.g., input VCC_HV, e.g., 1.2 V) though the input node 105 and supplies the current to analog node bias portion 104 that operates at a lower voltage domain level (e.g., 0.875 V) that may be referred to as VCCA domain for the analog node bias portion 104.

In particular, the source of M1 (e.g., protection device 120) may be coupled to the drain of M2 and the gate of M2 and M15. The source of M2 may be coupled to the drain of M13. The gate of M13 may be coupled to the input en (e.g., binary input 1 or 0—which is an indication of whether current is present: en=1 current present; en=0 current not present). The source of M13 may be coupled to ground. Similarly, the gate of M14 may be coupled to the input en and the source of M14 may be coupled to ground. The source of M15 may be coupled to the drain of M14.

Continuing with the structure of analog node bias portion 104, the gate of M1 may be coupled to the source of M3 (e.g., the bias receiver 124). The operation of the bias receiver 124 implemented by M3, will be discussed in more detail hereafter. The gate of M3 may be coupled to VCCA voltage/tie-high (e.g., 0.875 V) and the drain of M3 may be coupled to VCCA voltage/tie-high (e.g., 0.875 V).

Further, analog node bias portion 104 includes an auxiliary path including a diode stack 130 that includes M12, M11, M10, M9 that may be coupled to a PMOS switch M8 132 and a P-N diode. In particular, an auxiliary path current may flow to diode stack 130. In diode stack 130, current may flow to the source of M12 and the gate of M12 is connected to M12 drain forming a diode connection and the source of M12 may be coupled to the drain of M11 and the gate of M11. The source of M11 may be coupled to the drain of M10 and the gate of M10. The source of M11 may be coupled to drain of M10 and the gate of M10. The source of M10 may be coupled to drain of M9 and the gate of M9. The source of M9 may be coupled to the source M8 and through the P-N diode (within M8) to the M8 bulk. The bulk M8 is coupled to VCCA voltage. In one example, the PMOS switch M8 132 can be kept in separate well and can utilize a guard-ring 134. This may be used to isolate it and avoid any unnecessary coupling to the main substrate of other PMOS in design. The drain of M8 is coupled to the gate of M1 (e.g., protection device 120) and source of M3 (e.g., the bias receiver 124). The operation of this circuit structure implementation will be described in more detail hereafter.

As shown, in FIG. 2A, in operation, in a functional mode, when VCCA is in a non-collapse mode, and current is present (en=1), current will eventually flow to the drain of M1 and M1 will be turned on. In particular, when VCCA is in non-collapse mode, the gate of M3 of the bias receiver 124 is set to VCCA/tie-high (e.g., 0.875 V) and the drain of M3 is set to VCCA/tie-high (e.g., 0.875 V) such that the gate of M1 is set to V_PRO (e.g., voltage protective), which is VCCA. Also, PMOS switch M8 drain 132 will rise to VCCA such that M8 is turned off, such that the gate of M1 is VCCA. Therefore, the source of M3 rises to VCCA (e.g., 0.875) and M8 is turned off such that V_PRO (e.g., voltage protective) becomes VCCA as an input to the gate of M1.

In this way, the gate of M1 will be VCCA, M1 will be turned on and current will flow through the drain to the source of M1, and with EN=1, with M13 and M14, turned on, current will pass through M2 and M15 to the PMOS mirror. The PMOS mirror may act as the current output node. In this way, analog node bias portion 104 may pass the current on to another analog node 106, as previously described, that also operates at the lower voltage domain (e.g., 0.875 V). Or, analog node bias portion 104 may be part of the analog node itself and utilizes the current. Both analog node bias portion 104 and analog node 106 may utilize thin-oxide devices.

Therefore, in this example, when VCCA=1, EN=1:
a normal functional mode occurs;
875 mV (e.g., VCCA) is transferred to the M1 gate (e.g., protection device 120) by M3 (e.g., bias receiver 124);
voltage at ip25u=Vds of M1+(Vov+Vth) of M2+Vds of M3~400 mV at nominal;
M12-M9 diode stack does not conduct as PMOS switch 132 (M8 is OFF);
no reliability issues Another example operation is when current is not present (en=0) and VCCA is in a non-collapse mode. When en=0 there is no current being drawn, and the voltage at the input node 105 where current typically flows is the high voltage domain voltage from another analog node 100 (e.g., 1.2 V). As can be seen in FIG. 2A V=1.2V 160 is set as the input to the drain of M1 of the protection device 120. However, the gate of M3 of the bias receiver 124 is set to VCCA/tie-high (e.g., 0.875 V) and the drain of M3 is set to VCCA/tie-high (e.g., 0.875 V) such that the gate of M1 is set to V_PRO (e.g., voltage protective), which is VCCA. Also, PMOS switch M8 drain 132 will rise to VCCA such that M8 is turned off, such that the gate of M1 is VCCA. Therefore, the source of M3 rises to VCCA (e.g., 0.875) and M8 is turned off such that V_PRO becomes VCCA (e.g., 0.875 V) as an input to the gate of M1. In particular, in this instance, since there is no current flow, and the input voltage to the analog node bias portion 104 and to the drain of M1 is a high voltage domain level (e.g., approximately 1.2 V 160), and the input to the gate of M1 is approximately 0.875 volts, M1 does not turn on, and no current is drawn, since en=0. The bottom switches M13 & M14 are off. Also when Voltage at ip25u=1.2V, diode stack 130, e.g., M12 drain will be 1.2V and internal nodes n1, n2, n3, and n4 will leak a current in terms of few pA (~<5 pA) as M8 gate is VCCA & drain is close to 1.2V. This will make sure no reliability concerns are there.

Therefore, in this example, when VCCA=1, EN=0:
875 mV is transferred to the M1 gate by M3 and M8;
Voltage at ip25u=1.2V as no current is drawn.
No reliability issue for M1 (Vd=1.2V, Vg=0.875V);
No reliability issue for M2 (Vdg~0.875V);
M12-M9 diode stack will not conduct as PMOS switch is off (M8 is OFF); Leakage current can exist (few pA, ~5 pA).
M12-M9 diode stack does not conduct as PMOS switch is off (M8 is OFF); M8 drain (node n4) will be close to 1.2V and bulk is VCCA (0.875V), hence P-N diode (within M8) ON voltage is ~0.325V. Hence not turned ON.
No reliability issues for M12-M9 diode stacks max (Vd/g/s=1.2V as no current flows)

Figure 2B:
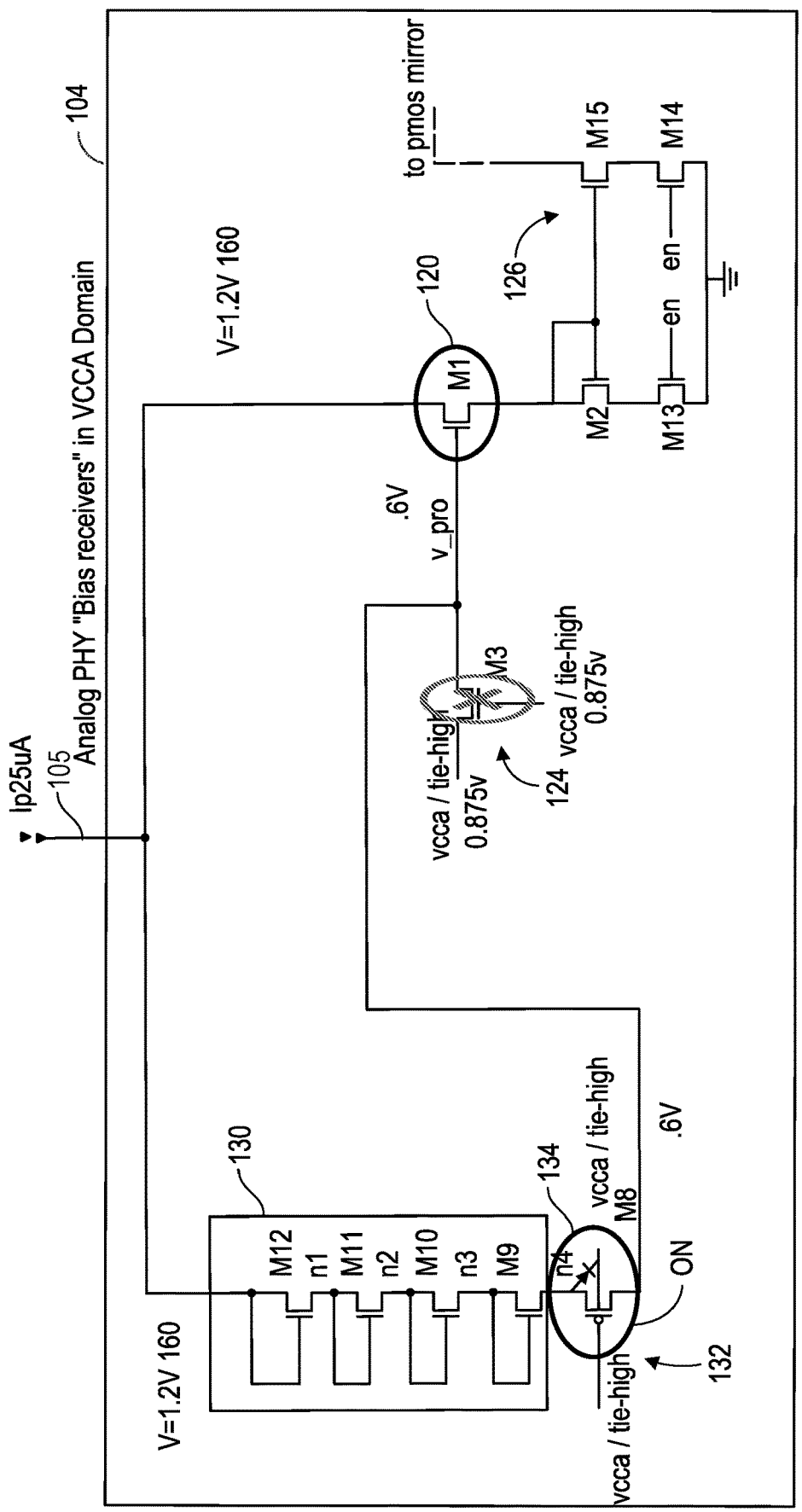
FIG. 2B illustrates a block diagram of an example analog node bias portion in accordance with an aspect of the disclosure.

FIG. 2B illustrates a block diagram of an example analog node bias portion 104 in accordance with another aspect of the disclosure. FIG. 2B illustrates another mode of operation, when VCCA is in a collapse mode (e.g., VCCA=0 V), and current is not present (en=0). As previously described, analog node bias portion 104 includes a protection device 120 implemented with M1. Further, protection device M1 may be coupled to bias receiver 124 implemented by M3. Also, coupled to M1 are M2, M13, M14, and M15 126 that may be coupled to a PMOS mirror. Additionally, M1 may be coupled to an auxiliary path including a diode stack 130 that includes M12, M11, M10, M9 that is coupled to a PMOS switch M8 132 and a P-N diode.

Looking more particularly, at FIG. 2B, in the analog node bias portion 104 structure, current (e.g., 25 uA) may typically flow to the source of M1. The current (e.g., 25 uA) may flow from the analog node 100 previously described that operates at a relatively higher voltage domain (e.g., input VCC_HV, e.g., 1.2 V) and supplies the current to analog node bias portion 104 that operates at a lower voltage domain (e.g., 0.875 V) that may be referred to as VCCA domain for the analog node bias portion 104. In particular, the drain of M1 (e.g., protection device 120) may be coupled to the drain of M2 and the gate of M2 and M15, as previously described with reference to FIG. 2A.

Continuing with structure of analog node bias portion 104, the gate of M1 may be coupled to the source of M3 (e.g., the bias receiver 124). The operation of the bias receiver 124 implemented by M3, will be discussed in more detail hereafter. The gate of M3 may be coupled to VCCA voltage/tie-high (e.g., 0.875 V) and the drain of M3 may be coupled to VCCA voltage/tic-high (e.g., 0.875 V). Further, analog node bias portion 104 includes an auxiliary path including a diode stack 130 that includes M12, M11, M10, M9 that may be coupled to a PMOS switch M8 132 and a P-N diode (internal to M8: Source-Bulk form PN diode). In particular, in the auxiliary path, current may flow to diode stack 130. In diode stack 130, current may flow to the drain of M12 with the gate of M12 connected to its drain and the source of M12 may be coupled to the drain of M11 and the gate of M11. The source of M11 may be coupled to the drain of M10 and the gate of M10. The source of M11 may be coupled to drain of M10 and the gate of M10. The source of M10 may be coupled to drain of M9 and the gate of M9. The source of M9 may be coupled to the source M8 and through the P-N diode to the M8 bulk. Both the bulk and the source of M8 are coupled VCCA/tie-high voltage. In one example, the PMOS switch M8 132 can be kept in a separate well and can utilize a guard-ring 134. This may be used to isolate it and avoid any un-necessary coupling to the main substrate of other PMOS in design. The drain of M8 is coupled to the gate of M1 (e.g., protection device 120) and source of M3 (e.g., the bias receiver 124). The operation of this circuit structure implementation will be described in more detail hereafter.

Another example operation is when current is not present (en=0) and VCCA is in a collapse mode (e.g., VCCA=0 V). When en=0 there is no current being drawn, the voltage at the input where current typically flows is the high voltage domain voltage from another analog node 100 (e.g., 1.2 V 160). As can be seen in FIG. 2B, V=1.2V 160 is set as the input to the drain of M1 of the protection device 120. Additionally, as can be seen in FIG. 2B, V=1.2V 160 is set as the input to the diode stack 130 that includes M12, M11, M10, M9 that is coupled to PMOS switch M8 132 and a P-N diode. (internal to M8: Source-Bulk form PN diode)

In operation, when VCCA is in a collapse mode, and current is not present (en=0), during VCCA collapse, M3 is completely turned off because there is no voltage at the gate or drain, such that M3 bias receiver 124 is completely turned off (as shown as X-off in FIG. 2B). Also, the gate of M8 goes towards VCCA=0.

Additionally, the bulk of M8 goes towards VCCA=0 and there is a diode between the source of M8 and the bulk, such that the current can increase exponentially. However, because of the diode stack 130 (M12-M9), the diode stack 130 conducts leakage current (e.g., ~5 nA at Nominal) which goes to PMOS switch M8 bulk (P-N diode) of the PMOS switch 132. By tuning diode stack/sizing/Vth "n4" node can be adjusted to a value <0.7V (e.g., voltage to turn on P-N junction), and hence control the leak current (~5 nA in nominal case), and PMOS switch 132 is turned ON. For example, the nominal value of "n4" node may be designed to be equal to 0.6V (e.g., or can be a lesser value). This can be used to generate the bias for M1 protection device 120 and reliability is solved.

In particular, even if there is a 1.2 voltage input 160 to the diode stack 130 and a 1.2 voltage input 160 to the M1 protection device 120 drain, the diode stack 130 will bring the voltage to approximately 0.6V from the M8 PMOS switch 132 and therefore V_PRO, such that the V_PRO (e.g., voltage protective) input to the gate of M1 protection device 120 is approximately 0.6V and even when the input to the drain M1 protection device 120 is approximately 1.2 V 160, M1 protection device 120 will not be switched on and no current will flow.

As has been described, in one example, the main PMOS switch M8 132 responsible for charging protection of M1 protection device 120 (e.g., bulk current during VCCA collapse to 0), can be kept in a separate well and can utilize a guard-ring 134. This may be used to isolate it and avoid any un-necessary coupling to the main substrate of other PMOS in design.

Therefore, when VCCA=0, EN=0–Supply Collapse Case:
Charging current flows: Vsource>bulk of PMOS switch M8 132. (e.g., 5 nA in Nominal)
M12-M9 diode stack 130 will turn on and voltage division occurs through the nodes n1, n2, n3 & n4.
Since PMOS switch M8 132 is ON, M1 gate protection device 120 is "divided voltage" of M9 source (~0.6V).
Bias receiver switch M3 124 isolates further leakage paths.
No reliability issues for M1 (Vg=0.6V, Vd=1.2V)
No reliability issues for M2 (Vdg=max Vg=0.6V)
No reliability issues for M12-M9 diode stacks max (Vd/g=1.2V, Vs=1.2-vds).
No reliability issues for M8 switch Vg/b=0, Vs=0.6V (Max allowed Vgb/Vsb/Vdb=1.98V)

Figure 3:
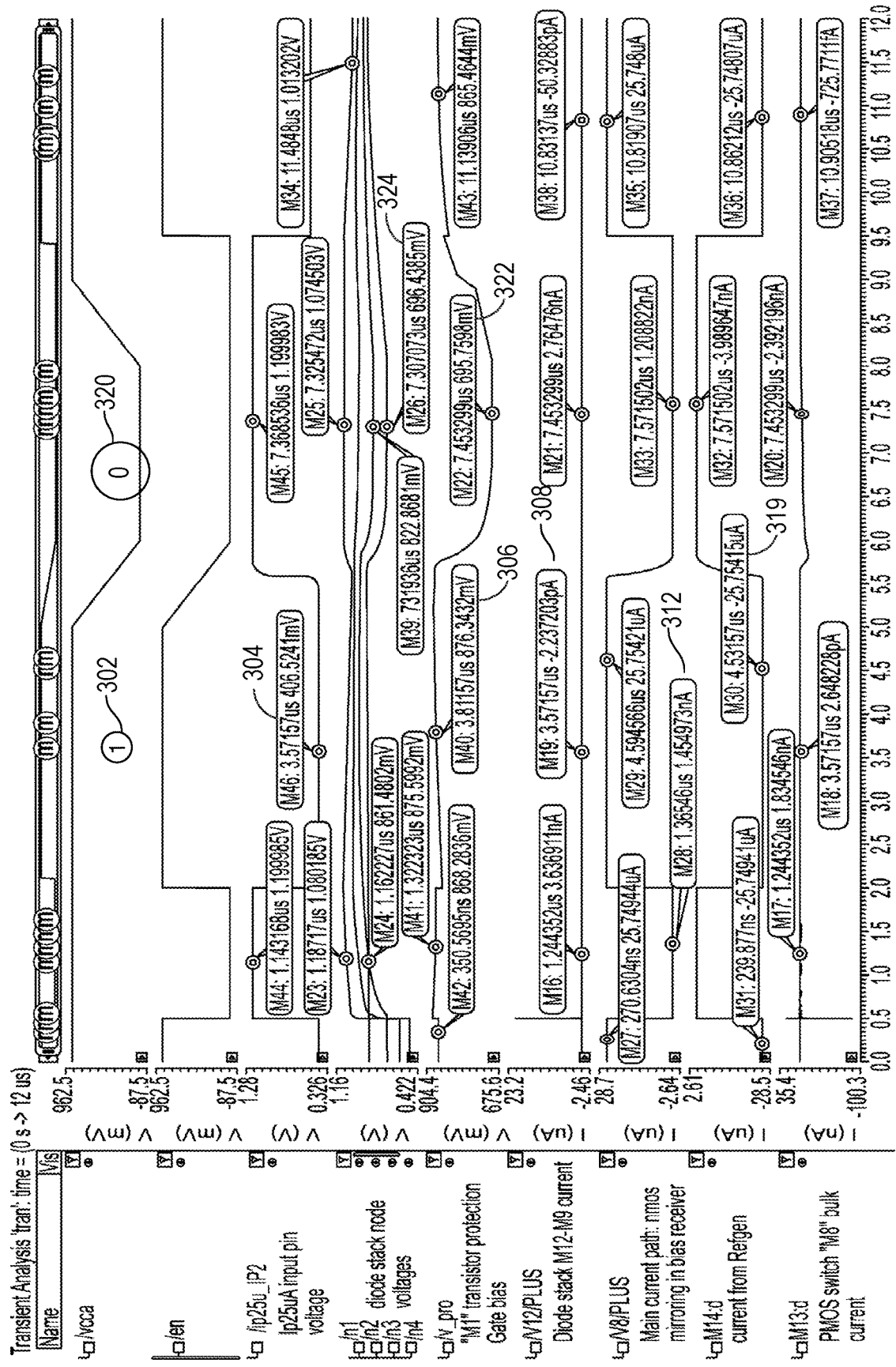
FIG. 3 illustrates a graph of function plots of node voltages and currents in accordance with another aspect of the disclosure.

FIG. 3 illustrates a graph of function plots of node voltages and currents in accordance with another aspect of the disclosure. FIG. 3 shows plots of VCCA, en (current on or off), input pin voltage, diode stack node voltages, M1 transistor protection gate bias, diode stack M12-M9 current, NMOS mirroring in bias receiver, current mirroring of input, PMOS switch M8 bulk current (e.g., where NMOS may stand for N-type metal oxide semiconductor and PMOS may stand for P-type metal oxide semiconductor). These plots show various measures of voltages and currents in the previously described operations of the analog node bias portion previously described. Not all of the measurements will be described. However, some of the measurements will be described to show the benefits and features of the previously described node bias portion.

As can be seen the input VCCA voltage varies between off and on and the current (en) varies between off and on. As can be seen in an operational state, when current is on than en is approximately 1 (circle 302), the input voltage at this time is approximately 400 mV (circle 304), the M1 transistor gate bias is set at VCCA (e.g., 876 mV) (circle 306), the diode stack node voltages will go to high, and the diode stack M12-M9 current will be approximately 0 (circle 308) as almost no current is flowing at that time, the main current path of the input current is approximately 25 uA (circle 312), and M14 tracks the input current of approximately 25 uA (circle 319).

However, as can be seen in a supply collapse state, state when VCCA goes to 0 (circle 320), diode stack current increases (circle 322) to a value 2.7 nA and M1 transistor protection gate bias goes to approximately 695 mV (circle 324) for the M1 protection device.

It should be further noted that FIG. 3 illustrates that for V_PRO: protection "nmos" voltage: when VCCA supply is present it is approximately 875 mV, and when vcca collapse, and the PMOS switch M8 Vsb is partially ON, the charge to Vbias (<0.7V) which provides protection. Further, as to the diode stack current: Nominal value <5 nA across all conditions. The current mirroring is proper for the main current path and M14. When VCCA is present M8 bulk current is 2 pA and when VCCA collapse, its <5 nA.

Based upon the previous description, an analog node 100 operating at a high voltage domain level, can continue to operate at its relatively high voltage domain level (e.g., 1.2V) and can operate with analog node 106 operating at a lower voltage domain level via the analog node bias portion 104. In this way, there is no need to compromise on headroom/mismatch by converting reference voltage design to a lower domain level (e.g. 0.875V). In particular, there is no need to bring the higher analog voltage domain level (e.g., 1.2V) to the other lower analog voltage domain level. The previously described analog node bias portion further reduces station current leakage. As one particular example, because the analog node bias portion 104 utilizes two paths: main functionality & auxiliary path (when VCCA collapses), in both cases, auxiliary path (e.g., utilizing diode stack) requires less than 3 nA at nominal levels. So there is no concern in main current mirroring. Also, no extra current pins are utilized to implement the analog node bias portion 104.

It should further be noted that analog node bias portion 104 does not require any area over-head and leakage during VCCA power collapse and can be controlled through the diode-stack and be kept at ~2 nA at nominal. In this way, the analog node bias portion 104 includes a compact design.

It should be noted that it is assumed that the analog node 100 with the high voltage domain level utilizes thin-oxide devices 102 and that the analog node bias portion 104 operating at the lower voltage domain level utilizes thin-oxide devices 107 and the analog node 106 operating at the lower voltage domain level utilizes thin-oxide devices 109. It should be noted that the proposed solution of the analog node bias portion 104 can be implemented at the analog physical layer utilizing the bias receiver and other components to mitigate reliability issues. As some examples, bandgap circuits for use in mobile station modems (MSMs) are often operated at a relatively high voltage domain level for better dynamic performance and reliability, but these relatively high voltage domain level devices need to operate with analog nodes operating at lower voltage level domains. Example of these lower voltage domain level analog nodes may include such analogs nodes as: universal serial bus (USB), display serial interface (DSI), Peripheral Component Interconnect Express (PCIE), Qlink, double date rate (DDR), and other types of nodes.

Figure 4:
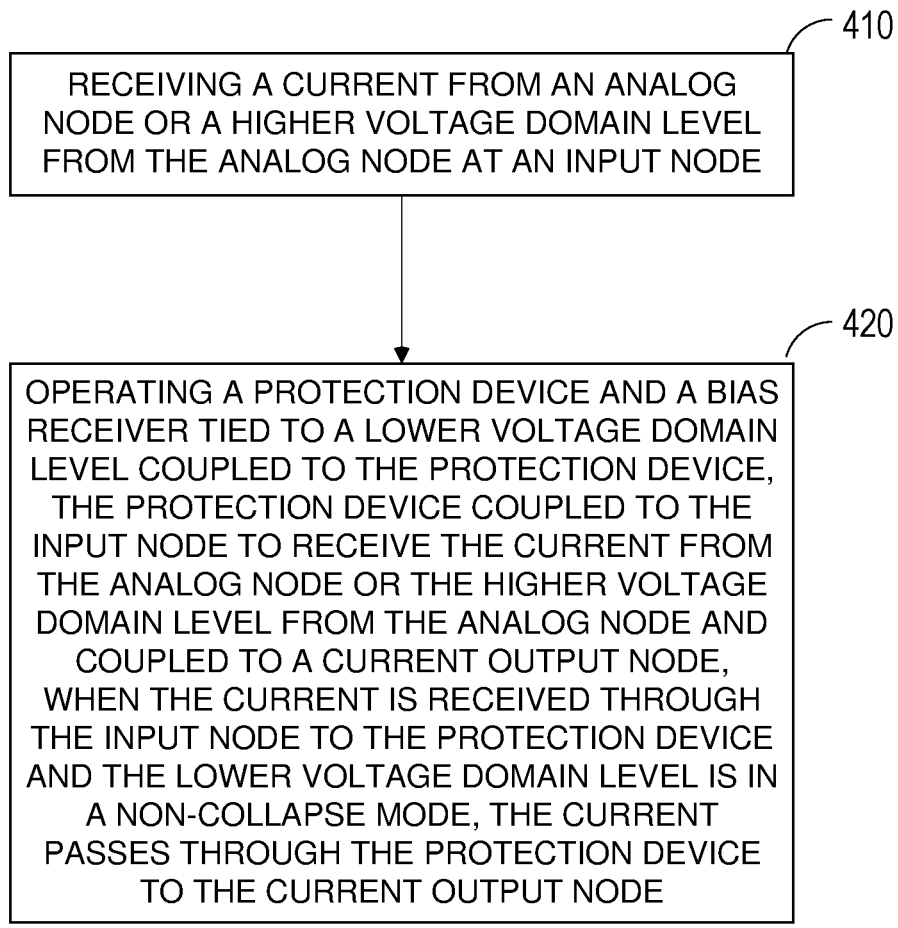
FIG. 4 illustrates a flow diagram of an example method of utilizing a high voltage aware bias receiver coupled to an analog node in accordance with another aspect of the disclosure.

FIG. 4 illustrates a flow diagram of an example method 400 of utilizing a high voltage aware bias receiver coupled to an analog node in accordance with another aspect of the disclosure. The method 400 includes: receiving a current from an analog node or a higher voltage domain level from the analog node at an input node (block 410). Further, the method 400 includes: operating a protection device and a bias receiver tied to a lower voltage domain level coupled to the protection device, in which, the protection device is coupled to the input node to receive the current from the analog node or the higher domain voltage level from the analog node and is coupled to a current output node, when current is received through the input node to the protection device and the lower voltage domain level is in a non-collapse mode, current passes through the protection device to the current output node (block 420). In another aspect, when current is not present at the input node and the lower voltage domain level is in a non-collapse mode, the method further includes: operating the protection device coupled to the input node to receive the higher voltage domain level from the analog node from the input node and to receive the lower voltage domain level from the bias receiver that is lower than the higher voltage domain level, such that the protection device does not turn on and no current is drawn.

Figure 5:
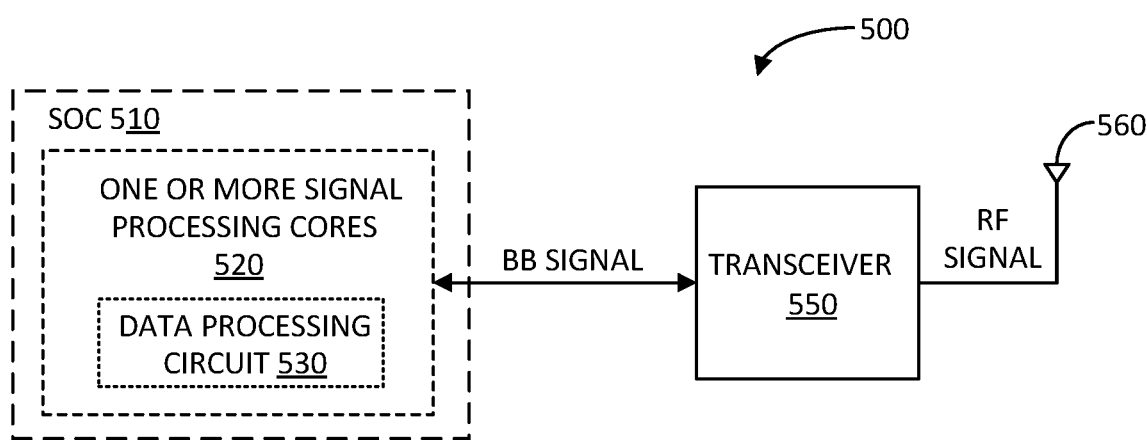
FIG. 5 illustrates a block diagram of an example wireless communication device in accordance with another aspect of the disclosure.

FIG. 5 illustrates a block diagram of an example wireless communication device 500 in accordance with another aspect of the disclosure. The wireless communication device 500 may be a smart phone, a desktop computer, laptop computer, tablet device, Internet of Things (IoT), wearable wireless device (e.g., wireless watch), and other types of wireless device.

In particular, the wireless communication device 500 includes an integrated circuit (IC), which may be implemented as a system on chip (SOC) 510. The SOC 510 includes one or more signal processing cores 520 including a data processing circuit 530. The one or more signal processing cores 520 may be configured to generate a transmit baseband (BB) signal and process a received baseband (BB) signal using the data processing circuit 530. The data processing circuit 530 or any of the other circuits may include the example analog node bias portion 104, previously described.

The wireless communication device 500 may further include a transceiver 550 and at least one antenna 560 (e.g., an antenna array). The transceiver 550 is coupled to the one or more signal processing cores 520 to receive therefrom the transmit BB signal and provide thereto the received BB signal. The transceiver 550 is configured to convert the transmit BB signal into a transmit radio frequency (RF) signal, and convert a received RF signal into the received BB signal. The transceiver 550 is coupled to the at least one antenna 560 to provide thereto the transmit RF signal for electromagnetic radiation into a wireless medium for wireless transmission, and receive the received RF signal electromagnetically picked up from the wireless medium by the at least one antenna 560.

The following provides an overview of aspects of the present disclosure:

Aspect 1: An apparatus, comprising: an input node; a bias receiver; and a protection device, a gate of the protection device coupled to the bias receiver, the bias receiver tied to a lower voltage domain level, a first source or drain of the protection device coupled to the input node to receive a current from an analog node or a higher voltage domain level from the analog node and a second drain or source of the protection device coupled to a current output node, when the current is received through the input node to the protection device and the lower voltage domain level is in a non-collapse mode, configured to pass the current through the protection device to the current output node.

Aspect 2: The apparatus of aspect 1, wherein, when the current is not present at the input node and the lower voltage domain level is in the non-collapse mode, the first source or drain of the protection device coupled to the input node receives the higher voltage domain level and the gate of the protection device receives the lower voltage domain level from the bias receiver that is lower than the higher voltage domain level, such that the protection device does not turn on and the current is not drawn.

Aspect 3: The apparatus of aspect 2, further comprising an auxiliary path including a diode stack coupled to a Metal Oxide-Semiconductor Field Effect Transistor (MOSFET) switch including a bulk having a diode, wherein, when the current is not present at the input node and the lower voltage domain level is in a collapse mode, the first source or drain of the protection device coupled to the input node receives the higher voltage domain level and the auxiliary path receives the higher voltage domain level.

Aspect 4: The apparatus of aspect 3, wherein, when the lower voltage domain level is in a collapse mode, the bias receiver is turned off, the diode stack of the auxiliary path reduces the higher voltage domain level to a voltage protective level to trigger the MOSFET switch including the bulk having the diode to turn on at the voltage protective level, the MOSFET switch is coupled to the gate of the protection device, the gate of the protection device receives the voltage protective level from the MOSFET switch that is lower than the higher voltage domain level, such that the protection device does not turn on and no current is drawn.

Aspect 5: The apparatus of aspect 4, wherein, the bias receiver, the protection device, or the MOSFET switch include a thin-oxide MOSFET.

Aspect 6: The apparatus of aspect 4, wherein, the bias receiver includes a MOSFET with a ground set to the lower voltage domain level, a drain set to the lower voltage domain level, and a source coupled to the gate of the protection device.

Aspect 7: The apparatus of aspect 4, wherein, the protection device includes a MOSFET with a ground set to the bias receiver and the MOSFET switch.

Aspect 8: The apparatus of aspect 4, wherein, the current output node includes a MOSFET mirror.

Aspect 9: The apparatus of aspect 4, wherein, the diode stack includes a plurality of coupled MOSFETs.

Aspect 10: The apparatus of aspect 4, wherein, the higher voltage domain level from the analog node is approximately 1.2 V.

Aspect 11: The apparatus of aspect 4, wherein, the lower voltage domain level is approximately 0.875 V.

Aspect 12: The apparatus of aspect 4, wherein, the voltage protective level is approximately 0.6 V.

Aspect 13: The apparatus of aspect 4, wherein, the current at the input node received from the analog node is approximately 25 uA.

Aspect 14: A method, comprising: receiving a current from an analog node or a higher voltage domain level from the analog node at an input node; and operating a protection device and a bias receiver tied to a lower voltage domain level coupled to the protection device, the protection device coupled to the input node to receive the current from the analog node or the higher voltage domain level from the analog node and coupled to a current output node, when the current is received through the input node to the protection device and the lower voltage domain level is in a non-collapse mode, the current passes through the protection device to the current output node.

Aspect 15: The method of aspect 14, wherein, when the current is not present at the input node and the lower voltage domain level is in the non-collapse mode, further comprising operating the protection device coupled to the input node to receive the higher voltage domain level from the analog node from the input node and to receive the lower voltage domain level from the bias receiver that is lower than the higher voltage domain level, such that the protection device does not turn on and the current is not drawn.

Aspect 16: The method of aspect 15, wherein, when the current is not present at the input node and the lower voltage domain level is in a collapse mode, further comprising operating an auxiliary path including a diode stack coupled to a Metal Oxide-Semiconductor Field Effect Transistor (MOSFET) switch including a bulk having a diode, wherein, the auxiliary path receives the higher voltage domain level, and operating the protection device coupled to the input node to receive the higher voltage domain level.

Aspect 17: The method of aspect 16, wherein, when the lower voltage domain level is in a collapse mode, operating the bias receiver to be turned off and operating the diode stack of the auxiliary path to reduce the higher voltage domain level to a voltage protective level to trigger the MOSFET switch to turn on at the voltage protective level, the MOSFET switch being coupled to the protection device, the protection device to receive the voltage protective level from the MOSFET switch that is lower than the higher voltage domain level at the protection device, such that the protection device does not turn on and the current is not drawn.

Aspect 18: The method of aspect 17, wherein, the bias receiver, the protection device, or the MOSFET switch include a thin-oxide MOSFET.

Aspect 19: The method of aspect 17, wherein, the bias receiver includes a MOSFET with a ground set to the lower voltage domain level, a drain set to the lower voltage domain level, and a source coupled to a gate of the protection device.

Aspect 20: The method of aspect 17, wherein, the protection device includes a MOSFET with a ground set to the bias receiver and the MOSFET switch.

Aspect 21: The method of aspect 17, wherein, the current output node includes a MOSFET mirror.

Aspect 22: The method of aspect 17, wherein, the diode stack includes a plurality of coupled MOSFETs.

Aspect 23: The method of aspect 17, wherein, the higher voltage domain level from the analog node is approximately 1.2 V.

Aspect 24: The method of aspect 17, wherein, the lower voltage domain level is approximately 0.875 V.

Aspect 25: The method of aspect 17, wherein, the voltage protective level is approximately 0.6 V.

Aspect 26: The method of aspect 17, wherein, the current at the input node received from the analog node is approximately 25 uA.

Aspect 27: An apparatus, comprising: means for receiving a current from an analog node or a higher voltage domain level from the analog node; means for passing the current through a protection device to a current output node, when the current is received by the protection device and a lower voltage domain level is in a non-collapse mode; and means for not passing the current through the protection device to the current output node, when the current is not present at the protection device, the higher voltage domain level is received at the protection device, and the lower voltage domain level is in the non-collapse mode.

Aspect 28: The apparatus of aspect 27, further comprising, means for not passing the current through the protection device to the current output node, when the current is not present at the protection device, the higher voltage domain level is received at the protection device, and the lower voltage domain level is in a collapse, including means for operating an auxiliary path that receives the higher voltage domain level and reduces the higher voltage domain level to a voltage protective level transmitted to the protection device that is lower than the higher voltage domain level at the protection device, such that the protection device does not turn on and no current is drawn.

Aspect 29: A wireless communication device, comprising: at least one antenna; a transceiver coupled to the at least one antenna; and one or more signal processing cores coupled to the transceiver, wherein the one or more signal processing cores comprise: an input node; a bias receiver; and a protection device, a gate of the protection device coupled to the bias receiver, the bias receiver tied to a lower voltage domain level, a first source or drain of the protection device coupled to the input node to receive a current from an analog node or a higher voltage domain level from the analog node and second drain or source of the protection device coupled to a current output node, when the current is received through the input node to the protection device and the lower voltage domain level is in a non-collapse mode, configured to pass the current through the protection device to the current output node.

Aspect 30: The wireless communication device of aspect 29, wherein, when the current is not present at the input node and the lower voltage domain level is in the non-collapse mode, the first source or drain of the protection device coupled to the input node receives the higher voltage domain level and the gate of the protection device receives the lower voltage domain level from the bias receiver that is lower than the higher voltage domain level, such that the protection device does not turn on and the current is not drawn.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus, comprising:
an input node;
a bias receiver; and
a protection device, a gate of the protection device coupled to the bias receiver, the bias receiver tied to a lower voltage domain level, a first source or drain of the protection device coupled to the input node to receive a current from an analog node or a higher voltage domain level from the analog node and a second drain or source of the protection device coupled to a current output node, when the current is received through the input node to the protection device and the lower voltage domain level is in a non-collapse mode, configured to pass the current through the protection device to the current output node.

2. The apparatus of claim 1, wherein, when the current is not present at the input node and the lower voltage domain level is in the non-collapse mode, the first source or drain of the protection device coupled to the input node receives the higher voltage domain level and the gate of the protection device receives the lower voltage domain level from the bias receiver that is lower than the higher voltage domain level, such that the protection device does not turn on and the current is not drawn.

3. The apparatus of claim 2, further comprising an auxiliary path including a diode stack coupled to a Metal Oxide-Semiconductor Field Effect Transistor (MOSFET) switch including a bulk having a diode, wherein, when the current is not present at the input node and the lower voltage domain level is in a collapse mode, the first source or drain of the protection device coupled to the input node receives the higher voltage domain level and the auxiliary path receives the higher voltage domain level.

4. The apparatus of claim 3, wherein, when the lower voltage domain level is in a collapse mode, the bias receiver is turned off, the diode stack of the auxiliary path reduces the higher voltage domain level to a voltage protective level to trigger the MOSFET switch including the bulk having the diode to turn on at the voltage protective level, the MOSFET switch is coupled to the gate of the protection device, the gate of the protection device receives the voltage protective level from the MOSFET switch that is lower than the higher voltage domain level, such that the protection device does not turn on and the current is not drawn.

5. The apparatus of claim 4, wherein, the bias receiver, the protection device, or the MOSFET switch include a thin-oxide MOSFET.

6. The apparatus of claim 4, wherein, the bias receiver includes a MOSFET with a ground set to the lower voltage domain level, a drain set to the lower voltage domain level, and a source coupled to the gate of the protection device.

7. The apparatus of claim 4, wherein, the protection device includes a MOSFET with a ground set to the bias receiver and the MOSFET switch.

8. The apparatus of claim 4, wherein, the current output node includes a MOSFET mirror.

9. The apparatus of claim 4, wherein, the diode stack includes a plurality of coupled MOSFETs.

10. The apparatus of claim 4, wherein, the higher voltage domain level from the analog node is approximately 1.2 V.

11. The apparatus of claim 4, wherein, the lower voltage domain level is approximately 0.875 V.

12. The apparatus of claim 4, wherein, the voltage protective level is approximately 0.6 V.

13. The apparatus of claim 4, wherein, the current at the input node received from the analog node is approximately 25 uA.

14. A method, comprising:
receiving a current from an analog node or a higher voltage domain level from the analog node at an input node; and
operating a protection device and a bias receiver tied to a lower voltage domain level coupled to the protection device, the protection device coupled to the input node to receive the current from the analog node or the higher voltage domain level from the analog node and coupled to a current output node, when the current is received through the input node to the protection device and the lower voltage domain level is in a non-collapse mode, the current passes through the protection device to the current output node.

15. The method of claim 14, wherein, when the current is not present at the input node and the lower voltage domain level is in the non-collapse mode, further comprising operating the protection device coupled to the input node to receive the higher voltage domain level from the analog node from the input node and to receive the lower voltage domain level from the bias receiver that is lower than the higher voltage domain level, such that the protection device does not turn on and the current is not drawn.

16. The method of claim 15, wherein, when the current is not present at the input node and the lower voltage domain level is in a collapse mode, further comprising operating an auxiliary path including a diode stack coupled to a Metal Oxide-Semiconductor Field Effect Transistor (MOSFET) switch including a bulk having a diode, wherein, the auxiliary path receives the higher voltage domain level, and operating the protection device coupled to the input node to receive the higher voltage domain level.

17. The method of claim 16, wherein, when the lower voltage domain level is in a collapse mode, operating the bias receiver to be turned off and operating the diode stack of the auxiliary path to reduce the higher voltage domain level to a voltage protective level to trigger the MOSFET switch to turn on at the voltage protective level, the MOSFET switch being coupled to the protection device, the protection device to receive the voltage protective level from the MOSFET switch that is lower than the higher voltage domain level at the protection device, such that the protection device does not turn on and the current is not drawn.

18. The method of claim 17, wherein, the bias receiver, the protection device, or the MOSFET switch include a thin-oxide MOSFET.

19. An apparatus, comprising:
means for receiving a current from an analog node or a higher voltage domain level from the analog node;
means for passing the current through a protection device to a current output node, when the current is received by the protection device and a lower voltage domain level is in a non-collapse mode; and
means for not passing the current through the protection device to the current output node, when the current is not present at the protection device, the higher voltage domain level is received at the protection device, and the lower voltage domain level is in the non-collapse mode.

20. The apparatus of claim 19, further comprising, means for not passing the current through the protection device to the current output node, when the current is not present at the protection device, the higher voltage domain level is received at the protection device, and the lower voltage domain level is in a collapse, including means for operating an auxiliary path that receives the higher voltage domain level and reduces the higher voltage domain level to a voltage protective level transmitted to the protection device that is lower than the higher voltage domain level at the protection device, such that the protection device does not turn on and no current is drawn.

* * * * *